United States Patent
Kataoka

(10) Patent No.: US 10,515,882 B2
(45) Date of Patent: Dec. 24, 2019

(54) SEMICONDUCTOR DEVICE PACKAGE INCLUDING ELECTRODE SOLDER PADS AND ADDITIONAL SOLDER PADS

(71) Applicant: NICHIA CORPORATION, Anan-shi, Tokushima (JP)

(72) Inventor: Satoshi Kataoka, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/853,599

(22) Filed: Dec. 22, 2017

(65) Prior Publication Data
US 2018/0182695 A1 Jun. 28, 2018

(30) Foreign Application Priority Data
Dec. 26, 2016 (JP) ................. 2016-251579

(51) Int. Cl.
| | |
|---|---|
| H01L 23/498 | (2006.01) |
| H01L 33/62 | (2010.01) |
| H01L 33/54 | (2010.01) |
| H01L 33/58 | (2010.01) |
| H01L 33/60 | (2010.01) |

(52) U.S. Cl.
CPC .. *H01L 23/49811* (2013.01); *H01L 23/49838* (2013.01); *H01L 33/62* (2013.01); *H01L 33/54* (2013.01); *H01L 33/58* (2013.01); *H01L 33/60* (2013.01)

(58) Field of Classification Search
CPC ......... H01L 23/49811; H01L 23/49838; H01L 33/62; H01L 33/54; H01L 33/58; H01L 33/60
See application file for complete search history.

(56) References Cited

U.S. PATENT DOCUMENTS

| | | | | |
|---|---|---|---|---|
| 8,235,551 | B2* | 8/2012 | Lin | ........................ F21K 9/00 257/696 |
| 2009/0289357 | A1* | 11/2009 | Fujimoto | .......... H01L 23/49838 257/737 |
| 2010/0157595 | A1* | 6/2010 | Lin | ........................ F21K 9/00 362/235 |

(Continued)

FOREIGN PATENT DOCUMENTS

| | | |
|---|---|---|
| JP | 2004-031934 A | 1/2004 |
| JP | 2004-281803 A | 10/2004 |

(Continued)

*Primary Examiner* — Peter Bradford
(74) *Attorney, Agent, or Firm* — Foley & Lardner LLP

(57) ABSTRACT

A package for a semiconductor device includes: a plate-shaped base member having a substantially rectangular shape in a plan view; a first and second electrode solder pads configured to be electrically connected to a semiconductor element when the semiconductor element is mounted on an upper surface of the base member, the electrode solder pads being disposed at a lower surface side of the base member to face each other in a first direction; and first and second auxiliary solder pads disposed on a lower surface of the base member, the auxiliary solder pads being disposed at both sides of the electrode solder pads such that the first and second electrode solder pads are disposed between the first and second auxiliary solder pads in a plan view.

22 Claims, 6 Drawing Sheets

(56) References Cited

U.S. PATENT DOCUMENTS

| | | | |
|---|---|---|---|
| 2013/0020590 A1* | 1/2013 | Lin | H01L 33/60 |
| | | | 257/88 |
| 2013/0033838 A1* | 2/2013 | Sato | G01C 19/5663 |
| | | | 361/777 |
| 2015/0144390 A1* | 5/2015 | Nejime | H01L 24/81 |
| | | | 174/261 |
| 2015/0340575 A1* | 11/2015 | Nakabayashi | H01L 33/486 |
| | | | 257/91 |
| 2017/0133567 A1* | 5/2017 | Fukasawa | H01L 33/38 |
| 2017/0186680 A1* | 6/2017 | Nishimura | H01L 23/49894 |
| 2017/0294322 A1 | 10/2017 | Morita et al. | |
| 2017/0317243 A1* | 11/2017 | Park | H01L 33/486 |

FOREIGN PATENT DOCUMENTS

| | | |
|---|---|---|
| JP | 2007-214514 A | 8/2007 |
| WO | WO-2016-047755 A1 | 3/2016 |

\* cited by examiner

SEMICONDUCTOR DEVICE PACKAGE INCLUDING ELECTRODE SOLDER PADS AND ADDITIONAL SOLDER PADS

CROSS-REFERENCE TO RELATED APPLICATIONS

The present application claims priority to Japanese Patent Application No. 2016-251579, filed on Dec. 26, 2016, the disclosure of which is hereby incorporated by reference in its entirety.

BACKGROUND

1. Technical Field

The present disclosure relates to a package for a semiconductor device, and a semiconductor device using the package.

2. Description of Related Art

It is known that, when a semiconductor device including a ceramic substrate is soldered onto a wiring substrate, due to difference between thermal expansion coefficient of the ceramic substrate and that of the wiring substrate, thermal stress associated with thermal processing is applied to solder connection portions, which may result in generation of cracks in the solder connection portions.

In a light emitting element ceramic package disclosed in JP 2007-214514 A, auxiliary solder pads are disposed on a substrate in a region at an outer side of a pair of electrode solder pads except for corner portions of the substrate, so that good connection reliability can be attained, and the package can be stably supported on a wiring substrate.

However, in the case where the size of each of the solder pads disposed at an outer side is reduced, self-alignment force is reduced, which may lead to decrease in mounting accuracy at the time of soldering of the package to the wiring substrate. Thus, a package having higher mountability is desired.

SUMMARY

An object of certain embodiments of the present disclosure is to provide a package for a semiconductor device and a semiconductor device that have good connection reliability and mountability, A package for a semiconductor device according to one embodiment has an upper surface on which at least one semiconductor element is to be mounted and includes: a flat plate-shaped base member having a substantially rectangular plan view shape; a pair of electrode solder pads to be electrically connected to the semiconductor element when the semiconductor element is mounted on the upper surface of the base member, the electrode solder pads disposed at a lower surface side of the base member to face each other in a first direction; and a pair of auxiliary solder pads disposed on a lower surface of the base member, the auxiliary solder pads disposed at both sides of the pair of electrode solder pads disposed therebetween in plan view. Each of the auxiliary solder pads has a length greater than a length of each of the electrode solder pads in a second direction perpendicular to the first direction.

Further, a semiconductor device according to certain embodiments of the present disclosure includes at least one semiconductor element mounted on the semiconductor light emitting device package.

According to certain embodiments of the present disclosure, it is possible to provide a package for a semiconductor device and a semiconductor device that have good connection reliability and mountability.

DETAILED DESCRIPTION OF EMBODIMENTS

Figure 1:
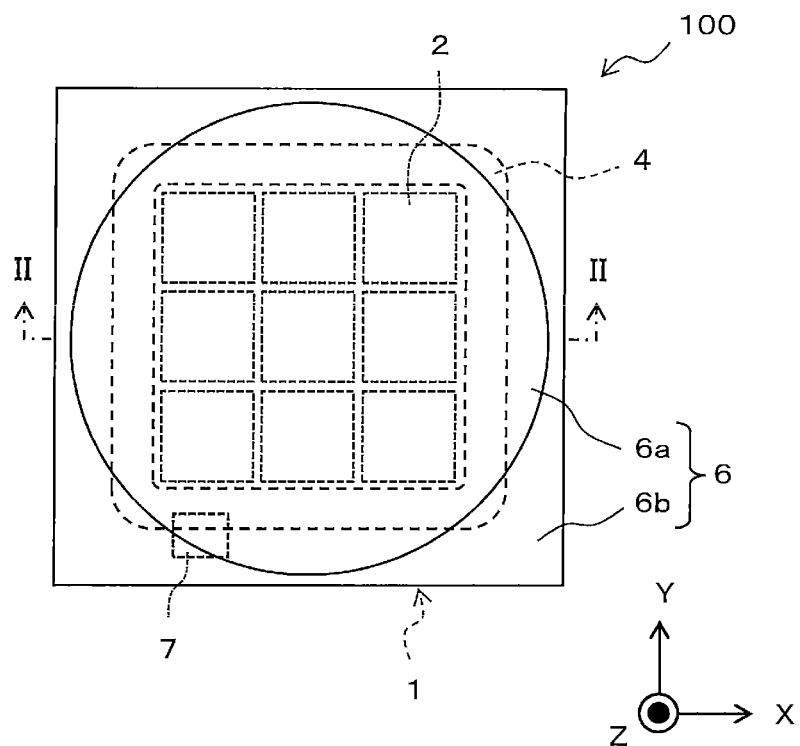
FIG. 1 is a plan view of a light emitting device according to a first embodiment.

Hereinafter, light emitting devices according to certain embodiments of the present disclosure will be described. The drawings referred to hereinafter schematically show certain embodiments of the present disclosure. Therefore, in the drawings, scales, intervals, positional relationships and so on of each member may be exaggerated, and illustrations of a portion of each member may be omitted. Scales or intervals of members in a plan view or a bottom view may not be the same with those in a corresponding cross-sectional view. Hereinafter, the same name and designation indicates the same or similar members in general, and detailed descriptions thereof may be omitted as necessary.

In the light emitting devices according to embodiments described below, "upper", "lower", "left", "right" and the like are interchangeable in accordance with the situation. In this specification, "upper", "lower" or the like indicates a relative position between constituent elements in a drawing referred to for explanation, and is not intended to show an absolute position unless otherwise specified.

In each of the drawings, an observation direction is described using XYZ coordinate axes for convenience of explanation. A surface parallel to a principal surface of a base member 10 is referred to as an "XY plane", and a direction perpendicular to the XY plane is referred to as a "Z axis direction". The principal surface of the base member 10 has a substantially rectangular shape, and a direction parallel to one side of the substantially rectangular shape is referred to as an "X axis direction", and a direction parallel to a side perpendicular to the one side of the substantially rectangular shape is referred to as a "Y axis". A direction of light extraction from a light emitting device 100 is referred to as a "positive direction on the Z axis".

First Embodiment

A light emitting device according to a first embodiment will be described below with reference to FIGS. 1 to 3.

The light emitting device 100 (i.e., semiconductor device) according to the first embodiment includes a flat plate-like package (i.e., a package for a semiconductor device) 1 having a substantially rectangular shape in plan view, light emitting elements 2 disposed on an upper surface of the package 1, a light reflecting member 3, a light-transmissive member, 5 and a sealing member 6.

In the present embodiment, the light emitting elements 2, each of which is a semiconductor element, are mounted on a package for a semiconductor device 1, and the light emitting device 100 is configured as a semiconductor device. Each of the semiconductor elements mounted on the package 1 is not limited to be a light emitting element such as a light emitting diode or a laser diode, and alternatively a transistor, IC, LSI, a Zener diode, a light receiving element or the like can be used.

Package

The package 1 includes a plate-shaped base member 10, a wiring 11 disposed on a first principal surface 10a, which is an upper surface of the base member 10, a pair of electrode solder pads 12 disposed on a second principal surface 10b, which is a lower surface of the base member 10, and a plurality of auxiliary solder pads 13.

In this specification, the "package" refers to a member for mounting one or more semiconductor elements such as the light emitting elements 2, and includes the base member 10, the wirings 11, the electrode solder pads 12, the auxiliary solder pads 13, etc. The "semiconductor device" refers to the package and a semiconductor element mounted in the package, and may further include the light reflecting member 3, a frame body 4, the light-transmissive member 5, the sealing member 6, etc.

Base Member

The base member 10 is a flat plate-shaped member having a substantially rectangular shape in plan view, more specifically a substantially square shape in plan view.

The first principal surface 10a of the base member 10 is a surface of the base member 10 on which the light emitting elements 2 are to be mounted, and the wirings 11, each of which is to be electrically connected to a respective one of the mounted light emitting elements 2, are disposed at a first principal surface 10a side.

The second principal surface 10b of the base member 10 is a mounting surface for bonding the light emitting device 100 to a mounting substrate, and a pair of electrode solder pads 12 and a plurality of auxiliary solder pads 13 are mounted on the second principal surface 10b.

Wiring

The wirings 11 are wiring patterns disposed at the first principal surface 10a side of the base member 10, and each of which is electrically connected to a respective one of the light emitting elements 2 using an electrically conductive member such as a solder or wire. The wirings 11 are electrically connected to the electrode solder pads 12 directly or through via holes etc.

Electrode Solder Pad and Auxiliary Solder Pad

Each of the electrode solder pads 12 is a terminal electrode for electrically connecting the light emitting device 100 to the mounting substrate by soldering.

The larger the area of each of the electrode solder pads 12 is, the more easily the electrode solder pads 12 receive stress due to difference between linear expansion coefficient of the base member 10 and that of the mounting substrate, so that cracks may be generated in a solder part. Such a crack may cause a problem such as an increase in voltage, which may lead to non-lighting of the light emitting device 100. In this embodiment, the electrode solder pads 12 are disposed at a central part except for an outer periphery of the base member 10 for reducing the influence of thermal stress due to difference between linear expansion coefficient of each of the electrode solder pads 12 and that of the mounting substrate for mounting the light emitting device 100.

If the solder pads is not disposed in the vicinity of the outer periphery of the base member 10, a self-alignment effect utilizing surface tension of a molten solder is hardly exhibited, so that mountability is deteriorated in view of alignment.

In this embodiment, a plurality of auxiliary solder pads 13 are disposed in addition to the electrode solder pads 12 for obtaining a self-alignment effect. Each of the plurality of auxiliary solder pads 13 is disposed at an outer periphery of the second principal surface 10b of the base member 10 separately at a respective one of a pair of opposing sides of the substantially rectangular shape, which is a plan view of the second principal surface 10b. With the solder pads disposed in the vicinity of the outer periphery of the base member 10, the self-alignment effect is enhanced to improve mountability.

Further, with the auxiliary solder pads 13, the region on which a molten solder is placed is enlarged compared with a case where only the electrode solder pads 12 each having a relatively small area with respect to the planar area of the base member 10, and thus the contact area between each of the solder pads and a respective one of the solder portions is increased. Thus, a difference between the amounts of solder disposed on the solder pads is greatly reduced, so that during mounting, inclination of the light emitting device 100 to a surface of the mounting substrate can be suppressed.

The expression "the solder pads disposed in the vicinity of the outer periphery of the base member 10" refers to that the spacing distance between the outer periphery of the base member 10 and the outer periphery of a respective one of the solder pads is equal to or less than 10% of the width of the base member 10 in a spacing direction (i.e., a first direction).

Further, with the electrode solder pads 12 having a size smaller than the planar area of the base member 10, cracks are hardly generated in solder for bonding the electrode solder pads 12. Each of the auxiliary solder pads 13 is not electrically connected to a respective one of the electrode solder pads 12, and therefore, even if cracks are generated in the solder for bonding the auxiliary solder pads 13, non-lightning of the light emitting device 100 can be inhibited.

In plan view, an area in which each of the auxiliary solder pads 13 is disposed is preferably larger than an area in which each of the electrode solder pads 12 is disposed. With the auxiliary solder pads 13 each having a larger area disposed at the outer side of the electrode solder pads 12, a stress due to thermal expansion and an external stress that are applied on the electrode solder pads 12 can be relaxed. Thus, bonding of the electrode solder pads 12 by solder can be maintained to be in a better state.

The self-alignment force is proportional to a length of the outer periphery of a portion where each of the solder pads and a respective solder portion are in contact with each other. Thus, the length of each of the auxiliary solder pads 13 along the outer periphery of the base member 10 is preferably as large as possible.

More specifically, in this embodiment, the pair of electrode solder pads 12 are disposed at substantially the central part of the second principal surface 10b such that they are spaced apart from each other in the first direction (i.e., in the X axis direction). The first direction is preferably parallel to one side of the substantially rectangular plan view shape of the base member 10. The pair of auxiliary solder pads are spaced apart from each other in the first direction, and each of the auxiliary solder pads is disposed along a respective one of one side and the opposite side of the substantially rectangular plan view shape of the base member 10.

The pair of electrode solder pads 12 are formed at an inner side of the pair of auxiliary solder pads 13 in plan view. The expression "an inner side of the pair of auxiliary solder pads 13" refers to an inside of a region between a pair of auxiliary solder pads 13. In this embodiment, the electrode solder pads 12 and the auxiliary solder pads 13 are disposed substantially in left-right symmetry in plan view. Each of the pair of auxiliary solder pads 13 has a length in a second direction (i.e., Y axis direction), which is a direction perpendicular to the first direction in plan view, greater than that of each of the electrode solder pads 12. For enhancing the self-alignment effect, the greater the length of each of the auxiliary solder pads 13 in the second direction is, the more preferable. Thus, it is preferable that each of the auxiliary solder pads 13 has a substantially rectangular shape in which the second direction is a longitudinal direction in plan view, and is disposed such that the longitudinal direction is substantially parallel to one side of the substantially elongated rectangular plan view shape of the base member 10. Each of the auxiliary solder pads 13 more preferably has a length in the second direction that is substantially equal to the length of one side of the substantially rectangular plan view shape of the base member 10.

Further, it is preferable that each of the electrode solder pads 12 has a substantially elongated rectangular plan view shape in which a longitudinal direction thereof is substantially parallel to the second direction. With the longitudinal direction of each of the electrode solder pads 12 and the longitudinal direction of a respective one the auxiliary solder pads 13 substantially parallel to each other, the self-alignment effect can be further enhanced.

In view of mass productivity, the auxiliary solder pads 13 are disposed at an inner side of the outer periphery of the second principal surface 10b of the base member 10. For improving mass production, there is a method of manufacturing the package 1 in which a collective body having such a size that allows base members 10 corresponding to a plurality of packages to be arranged in a matrix is provided, the wiring 11, the electrode solder pads 12 and the auxiliary solder pads 13 are integrally formed, and the base members 10 are cut along boundary lines demarcating into each package 1 to singulate the collective body. If the auxiliary solder pads 13 are present on the boundary line along which the collective body is cut, the base member 10 made of, for example, a ceramic, and one or more of the auxiliary solder pads 13 each made of a metal, which is a material different from a ceramic, need to be simultaneously cut, which may lead to reduction in efficiency of singulation. Preventing each of the auxiliary solder pads 13 from being disposed on a respective one of the boundary lines allows the package 1 to be singulated by cutting only the base member 10, and therefore efficiency of singulation can be improved.

The spacing distance between the outer periphery of the base member 10 and the auxiliary solder pads 13 is in accordance with accuracy of cutting in singulation, and is preferably approximately 100 μm or more.

An example of lands to be disposed on the mounting substrate for mounting the light emitting device 100 will be described below with reference to FIG. 4.

Figure 4:
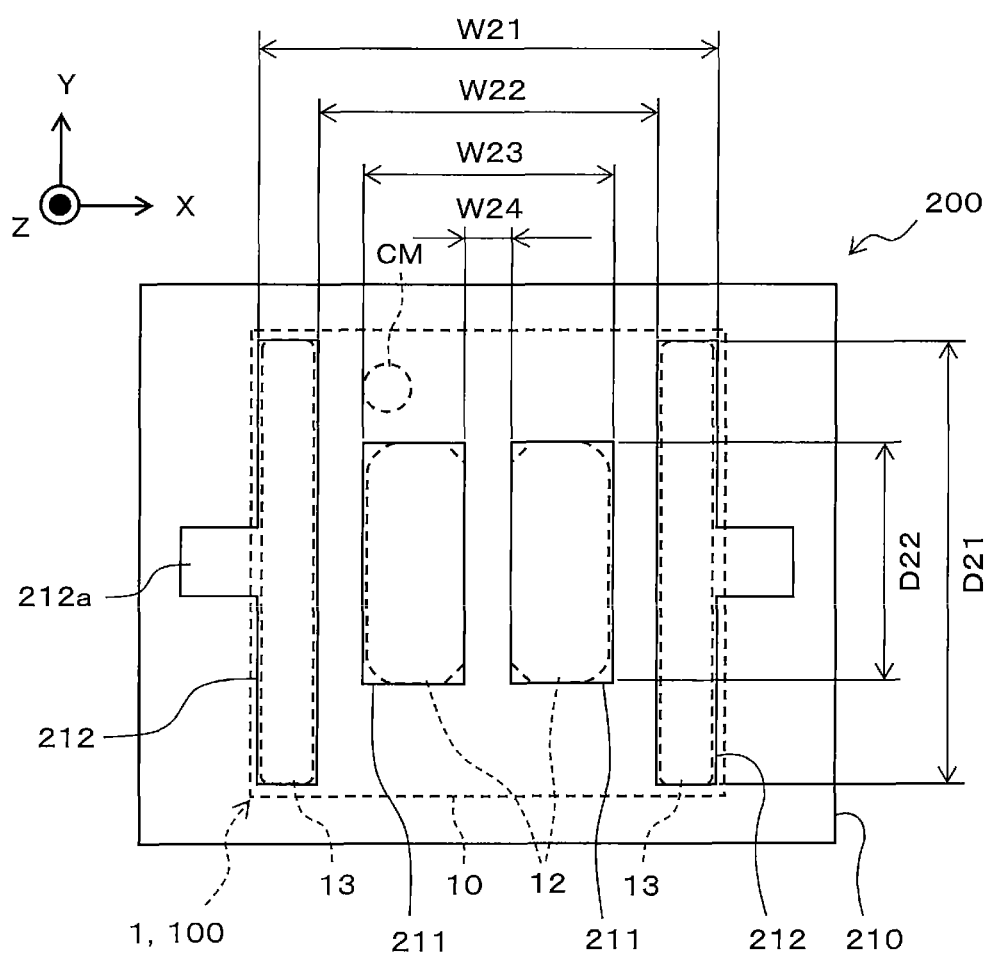
FIG. 4 is a plan view showing an example of lands of a mounting substrate on which the light emitting device according to the first embodiment is to be mounted.

As shown in FIG. 4, in a mounting substrate 200, on an upper surface of a flat plate-shaped base member 210, a pair of electrode solder pad lands 211, each of which corresponds to a respective one of the pair of electrode solder pads 12 of the light emitting device 100, and a pair of auxiliary solder pad lands 212, each of which corresponds to a respective one of the pair of auxiliary solder pads 13 of the light emitting device 100. It is preferable that each of the electrode solder pad lands 211 and each of the auxiliary solder pad lands 212 preferably have substantially the same dimensions as the dimensions of a corresponding one of the electrode solder pads 12 and a corresponding one of the auxiliary solder pads 13, respectively.

In an example shown in FIG. 4, a size of each of the electrode solder pad lands 211 and a size of each of the auxiliary solder pad lands 212 is slightly greater in the first direction (X axis direction) and is the same in the second direction (Y axis direction) than the size of a corresponding one of the electrode solder pads 12 and the size of a corresponding the auxiliary solder pads 13, respectively. In this example, each of the auxiliary solder pad lands 212 includes a protrusion portion 212a protruding outward.

The protrusion portion 212a is disposed for measurement of the temperature of the solder parts to confirm a heat dissipation design.

In FIG. 4, only the electrode solder pad lands 211 and the auxiliary solder pad lands 212 to be bonded to a corresponding one of the electrode solder pads 12 and a corresponding one of the auxiliary solder pads 13, respectively, of the light emitting device 100 are shown. Each of the electrode solder pad lands 211 is connected to a wiring, a via hole or the like, and incorporated in a predetermined circuit.

Configurations of the light emitting device 100 will be described below with reference to FIGS. 1 to 3 again.

Light Emitting Element (Semiconductor Element)

In each of the light emitting elements 2, for example, semiconductor layers are layered on an insulating substrate, and at least a pair of positive and negative electrodes are disposed at a surface of the light emitting element 2 at a semiconductor layer side. In the present embodiment, the light emitting elements 2 are flip-chip-mounted on the first principal surface 10a of the base member 10 using an electrically conductive bonding material such as a solder or a metal bump, and electrically connected to the wirings 11. Further, in the present embodiment, the light reflecting member 3 is disposed to cover lateral surfaces of each of the light emitting elements 2 such that the light reflecting member 3 is in contact with the lateral surfaces of each of the light emitting elements 2, which allows light to be extracted from the upper surface of the light emitting element 2.

Figure 2:
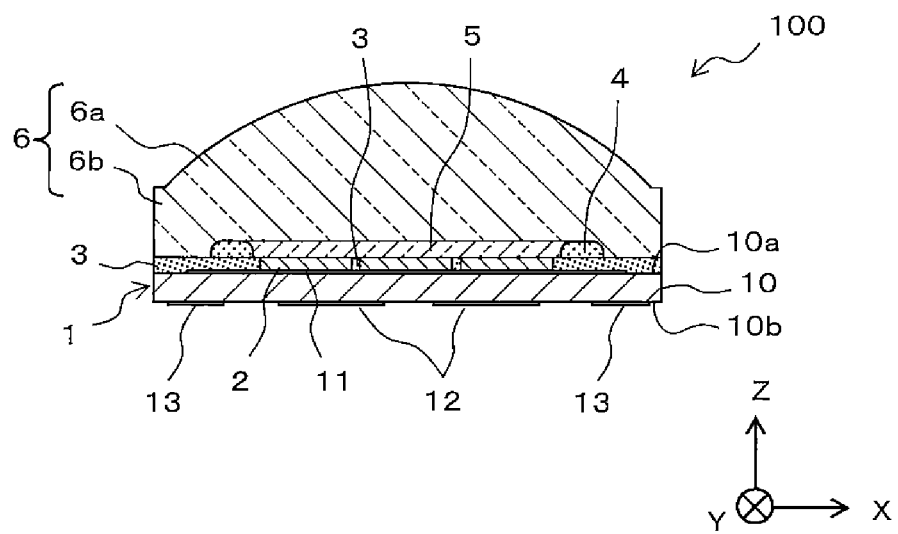
FIG. 2 is a cross-sectional view of the light emitting device according to the first embodiment taken along a line II-II in FIGS. 1 and 3.

In this embodiment, the light emitting element 2 has a substantially square plan view shape, and as shown in FIG. 1, nine light emitting elements 2 are disposed in 3 by 3 matrix. Each of the light emitting elements 2 is electrically connected to a respective one of the electrode solder pads 12 through a respective one of the wirings 11.

Each of the light emitting elements 2 may be face-up-mounted on the first principal surface 10a of the base member 10 using a solder, a die bond resin or the like, and is electrically connected to a respective one of the wirings 11 using a metal wire.

Adjacent two of the light emitting elements 2 in plan view may be arranged with any appropriate distance therebetween, and for example, the distance between adjacent two of the light emitting elements 2 is preferably smaller than a length of one side of each of the light emitting elements 2. In particular, with the distance between adjacent two of light emitting elements 2 in a range of 1 μm to 300 μm, more preferably in a range of 50 μm to 100 μm, light can be diffused to a non-light-emitting region between light emitting elements 2 using a fluorescent material or a diffusion material. Thus, it is preferable that the light reflecting member 3 is disposed between adjacent two of the light emitting elements 2.

Light Reflecting Member

The light reflecting member 3 is disposed on the first principal surface 10a of the base member 10. The light reflecting member 3 is disposed for reducing absorption of light from the light emitting element 2 into other light emitting elements 2, the base member 10, the wirings 11, etc. The light reflecting member 3 preferably covers the entirety of region of the light emitting element 2 except for the upper surface of the light emitting element 2 on the first principal surface 10a of the base member 10. The light reflecting member 3 has an upper surface, which is preferably flat. The upper surface of the light reflecting member 3 may be in substantially the same plane as the upper surface of each of the light emitting elements 2, or may be located at a position higher than the upper surface of the light emitting element 2. The expression "in the same plane" includes a slight unintentional recess formed in the upper surface of the light reflecting member due to the weight of a resin of the light reflecting member, i.e. a height difference in the upper surface of the light-reflective member 3 about several tens of micrometers is allowed. Further, components other than the light emitting elements 2 (e.g. a protective element 7), which are placed on the base member 10, may be embedded in the light reflecting member 3. In this embodiment, a circular cathode mark CM is formed in the vicinity of one of the electrode solder pads 12 to indicate a polarity. For example, a notch may be formed in at least one of the pair of electrode solder pads 12 so that the pair of electrode solder pads 12 have shapes slightly different from each other, which can serve as an anode mark or a cathode mark to indicate a polarity.

Frame Body

The frame body 4 is disposed on the upper surface of the light reflecting member 3 so as to circularly surround a region where the light emitting element 2 is disposed in plan view. The frame body 4 can be made of a resin material containing a light-reflective substance. Light emitted from the light emitting element 2 is reflected at an inner lateral surface of the frame body 4.

For example, the distance between the outermost lateral surface of each of the outermost ones of the light emitting elements 2 and the inner lateral surface of the frame body 4 is preferably 300 µm or less, more preferably in a range of about 0 to 100 µm. With the frame body 4, the light emitting region of the light emitting device 100 is defined, so that the luminance of the light emitting device 100 can be enhanced.

Light-Transmissive Member

The light-transmissive member 5 is disposed in the frame body 4, i.e. in a recess surrounded by the frame body 4. In the present embodiment, the recess is defined by a bottom surface including the upper surface of each of the light emitting elements 2 and the upper surface of the light reflecting member 3, and lateral surfaces including the inner lateral surface of the frame body 4. The light-transmissive member 5 is disposed in the recess.

For the light-transmissive member 5, a resin material containing a wavelength conversion substance such as fluorescent material particles can be used. The light-transmissive member 5 can be formed by dropping (i.e., performing a potting technique) such a resin material into the frame body 4. In the case where a fluorescent material is used, it is preferable that the fluorescent material is in contact with the upper surface of each of the light emitting elements 2 in order to efficiently dissipate heat generated from the fluorescent material during wavelength conversion. Accordingly, it is preferable that, in the light-transmissive member 5, the fluorescent material is deposited on the bottom surface of the recess, i.e. at the light emitting element 2 side.

Sealing Member

The sealing member 6 is a light-transmissive member that covers the light reflecting member 3, the frame body 4, and the light-transmissive member 5. The sealing member 6 is disposed to allow light emitted from the light emitting element 2, that is, light emitted though the light-transmissive member 5, to be efficiently extracted toward outside. The sealing member 6 includes a lens portion 6a, and a flange portion 6b under the lens portion 6a to be extended toward the outer periphery of the sealing member 6.

As shown in FIG. 1, a portion of the frame body 4 is covered with the flange portion 6b. In order to improve light extraction efficiency, it is preferable that the size of the lens portion 6a is increased to the extent that light emitted from the light emitting element 2 is not totally reflected at the interface between the lens portion 6a and the outside. However, downsizing of the light emitting device 100 limits increase in size of the lens. Thus, a portion of the frame body 4 is covered with the flange portion 6b. In other words, the frame body 4 is disposed to extend over the lens portion 6a and the flange portion 6b in plan view. It is more preferable that a portion of the outer periphery of the frame body 4 is covered with the flange portion 6b, while an entirety of the inner surface of the frame body 4, i.e. an entirety of the outer edge of the light-transmissive member 5 in plan view is disposed under the lens portion 6a. Accordingly, downsizing of the light emitting device 100 can be achieved while a reduction in light extraction efficiency is inhibited.

Further, the outer periphery of the base member 10 and the outer periphery of the sealing member 6 correspond with each other in plan view, that is the lateral surface of the base member 10 and the lateral surface of the flange portion 6b of the sealing member 6 are in the same plane.

The first embodiment has been described above with reference to FIGS. 1 to 3. The base member 10 in the first embodiment does not necessarily have a flat plate shape, and may be a substrate with a recess where the semiconductor elements are disposed. The light reflecting member 3, the frame body 4, the light-transmissive member 5 and the sealing member 6 may be optionally disposed, and some or all of these members may not be disposed.

Materials of Constituent Members

Materials and the like suitable for the constituent members of the light emitting device 100 according to the first embodiment will be described below.

Base Member

The material of the base member 10 to on which semiconductor elements such the light emitting elements 2 is disposed is not limited to a ceramic, and examples thereof include various kinds of materials as described below. In the package 1 for a semiconductor device according to the first embodiment, cracks may be easily generated in a solder used for mounting in the case where there is a large difference between a linear expansion coefficient of the base member 10 and that of the mounting substrate for mounting the light emitting device 100 in which the package 1 is used. Accordingly, the package 1 is highly effective particularly in the case of using a mounting substrate having a linear expansion coefficient different from a linear expansion coefficient of the mounting substrate and the base member 10 by $3.0 \times 10^{-6}$/K or more, more preferably $15 \times 10^{-6}$/K or more.

The base member 10 can be made of an insulating material such as a glass epoxy, a resin or a ceramic material such as high temperature co-fired ceramic (HTCC) or low temperature co-fired ceramic (LTCC), a composite material of an insulating material and a metal material, or the like. For the base member 10, a ceramic or thermosetting resin, which have high heat resistance and weather resistance, is preferably used. Examples of the ceramic material include alumina, aluminum nitride and mullite. In particular, aluminum nitride that has high heat dissipation property is preferable. For the base member 10, such a ceramic material in combination with, for example, an insulating material such as a BT resin, a glass epoxy or an epoxy-based resin may be used. Examples of the thermosetting resin include an epoxy resin, a triazine derivative epoxy resin, a modified epoxy resin, a silicone resin, a modified silicone resin, an acrylate resin, and a urethane resin. In particular, a triazine derivative epoxy resin is more preferably used. The base member 10 preferably has a plate shape in which a surface on which the semiconductor elements such as the light emitting elements 2 is mounted is flat.

Electrode Solder Pads

Each of the electrode solder pads 12 can be a single layer or can have a multilayer structure. For the electrode solder pads 12, a metal such as copper, aluminum, gold, silver, tungsten, iron or nickel, an alloy such as an iron-nickel alloy or phosphor bronze, or the like can be used. The electrode solder pads 12 may have a thickness of, for example, several micrometers to several hundred micrometers.

The electrode solder pads 12 can be formed using a plating method, a sputtering method, a vapor deposition method, or the like. The electrode solder pads 12 may be formed by molding a plate-shaped metal lead frame integrally with the base member 10 to allow a portion of the lead frame exposed from the second principal surface 10b of the base member 10 to serve as the electrode solder pads 12.

Auxiliary Solder Pads

The auxiliary solder pads 13 may be made of a material similar to the material of the electrode solder pads 12, and may have a thickness similar to a thickness of the electrode solder pads 12. The auxiliary pads 13 does not serve to supply electricity and allows for improving mountability, and the electrode solder pads 12 serves to supply electricity, so that a function of the auxiliary pads 13 and a function of the electrode solder pads 12 can be separated from each other. Accordingly, even if cracks are generated in solder portions, each of which is connected to a respective one of the auxiliary solder pads 13, reliability in connection is not impaired.

As in the electrode solder pads 12, the auxiliary solder pads 13 can be formed by using a plating method, a sputtering method, a vapor deposition method or the like.

Wiring

The wirings 11 can be made of a material similar to that of the electrode solder pads 12, and can be formed by using a method similar to that used for forming the electrode solder pads 12. A portion of the lead frame may be exposed to the first principal surface 10a of the base member 10, which can be used as wirings for establishing electrical connection with the light emitting element 2.

Light Emitting Element

For each of the light emitting elements 2, which are one example of the semiconductor elements, for example, a semiconductor light emitting element such as a light emitting diode chip can be used. The semiconductor light emitting element may include a light-transmissive substrate, and a semiconductor layered body formed on the light-transmissive substrate. Examples of the light-transmissive substrate include a light-transmissive insulating material such as sapphire (i.e., $Al_2O_3$), and a semiconductor material (e.g. nitride-based semiconductor material) adapted to transmit light emitted from the semiconductor layered body.

The semiconductor layered body includes, for example, a plurality of semiconductor layers such as an n-type semiconductor layer, a light emitting layer (i.e., active layer), and a p-type semiconductor layer. The semiconductor layer can be made of, for example, a semiconductor material such as a Group III-V compound semiconductor or a Group II-VI compound semiconductor. More specifically, a nitride-based semiconductor material such as $In_XAl_YGa_{1-X-Y}N$ ($0 \leq X$, $0 \leq Y$, $X+Y \leq 1$) can be used.

For the electrodes of each of the light emitting elements 2, a good electrical conductor can be used, and for example, a metal such as Cu or Au is preferably used.

Light Reflecting Member

The light reflecting member 3 is an insulator, and can be made of a light reflective-resin having strength of a certain degree. The "light-reflective resin" refers to a resin having a high reflectance, that is, for example, a resin that reflects 70% or more of light emitted from the light emitting element 2.

Examples of the light-reflective resin include a light-transmissive resin in which a light-reflective substance is dispersed. For the light-reflective substance, for example, titanium oxide, silicon dioxide, zirconium dioxide, potassium titanate, alumina, aluminum nitride, boron nitride or mullite can be preferably used. The light reflecting substance may have a shape of particles, fibers, thin plate pieces, or the like. In particular, the light reflecting substance having a shape of fibers allows a thermal expansion coefficient of the light reflecting member 3 to be reduced, so that a difference between the thermal expansion coefficient of the light reflecting member 3 and that of, for example, the light emitting element 2 can be reduced, and thus is preferable. In particular, the light-transmissive resin is preferably a thermosetting resin such as a silicone resin, a silicone-modified resin, an epoxy resin or a phenol resin.

Frame Body

The frame body 4 has inner lateral surfaces reflecting light laterally emitted from the light emitting element 2 upward, and thus the frame body 4 serves as a reflecting plate to improve light emission efficiency of the light emitting device 100.

For the frame body 4, a material which can be applied onto the light reflecting member 3 in the form of a liquid or a paste and can be solidified or cured to be formed into the frame body 4 is preferably used. In order to form the frame body 4 having a sufficient height to serve as a dam during charging the light-transmissive member 5, a material in a form of a paste, that is, a liquid material having a high viscosity (e.g. viscosity in a range of 380 to 450 Pa-s at 25° C.) is preferably used as a base material of the frame body 4. Examples of such a material include thermosetting resins and thermoplastic resins, more specifically, a phenol resin, an epoxy resin, a BT resin, PPA and a silicone resin. The frame body 4 preferably has a white color to increase reflectance. In order to further increase reflectance, during formation of the frame body 4, a powder of a light reflecting material (e.g. $TiO_2$, $Al_2O_3$, $ZrO_2$, MgO, ZnO or the like), which less easily absorbs light emitted by the light emitting element 2 and has refractive index greatly different from that of the base material of the frame body 4, is dispersed in the resin material.

Light-Transmissive Member

For the light-transmissive member 5, a light-transmissive resin material to be used for sealing a general light emitting device including a light emitting diode etc., can be used, and specific examples of such a light-transmissive resin material include silicone resins, epoxy resins, and urea resins. The frame body 4, which is formed earlier, serves as a dam, so that a liquid resin material having a relatively low viscosity (e.g. viscosity at 25° C.: 0.01 to 5.0 Pa·s) can be used for the light-transmissive resin, and the light-transmissive resin can be easily charged even in a small region.

In the case where, in the light-transmissive member 5, a wavelength conversion substance (i.e., substance having a certain degree of specific gravity, e.g. fluorescent material particles) is mixed with such a low-viscosity resin material, the wavelength conversion substance is easily precipitated before the mixture is cured. Thus, the wavelength conversion substance is distributed predominantly in the vicinity of the upper surface of the light emitting element 2, so that light emitted by the light-emitting element 2 is suitably wavelength-converted. The resin material may contain a coloring agent, a light diffusing agent, other filler, etc., according to a purpose and a use, as well as the wavelength conversion substance.

The wavelength conversion substance may be a material adapted to be excited by light emitted from at least the light emitting elements 2 and to emit light having a different wavelength upon the excitation. For example, a fluorescent material, a light emitting substance which is a so-called nanocrystals or quantum dots (i.e., Q-Dots), or the like can be used.

Sealing Member

Examples of a light-transmissive material used for the sealing member 6 include thermosetting resins such as a silicone resin, a silicone-modified resin, an epoxy resin and a phenol resin, and thermoplastic resins such as a polycarbonate resin, an acrylic resin, a methyl pentene resin and a polynorbornene resin. In particular, a silicone resin, which has good light resistance and heat resistance, is preferably used.

Second Embodiment

Figure 5A:
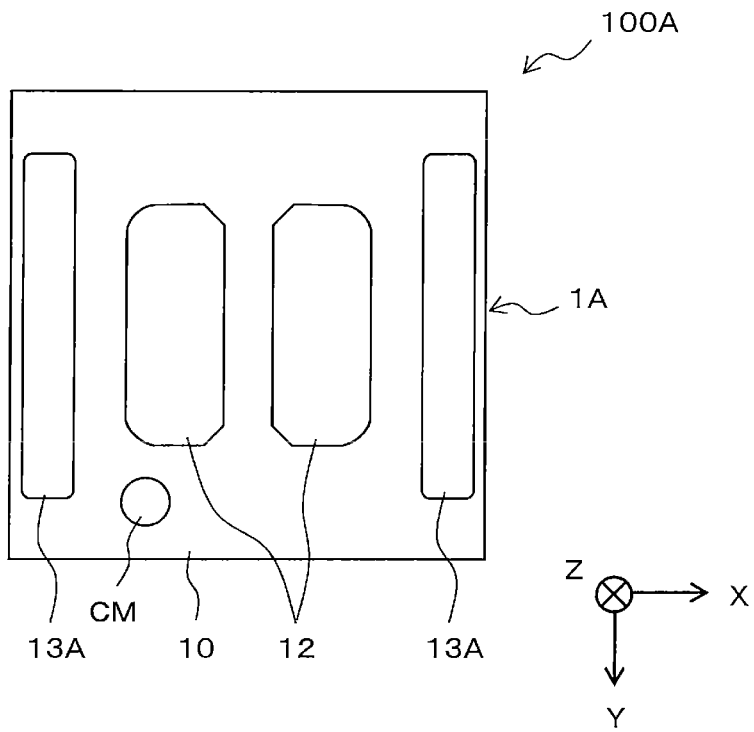
FIG. 5A is a bottom view of a light emitting device according to a second embodiment.

A light emitting device according to a second embodiment will be described below with reference to FIG. 5A.

The light emitting device 100A according to the second embodiment is different from the light emitting device 100 according to the first embodiment in that the light emitting device 100A includes a package 1A including auxiliary solder pads 13A in place of the package 1 including auxiliary solder pads 13. The light emitting device 100A is the same as the light emitting device 100 except for the shape of each of the auxiliary solder pads 13A, and accordingly descriptions of other members in the light emitting device 100A are omitted.

Each of the auxiliary solder pads 13A in the present embodiment has a length in the Y axis direction, which is the second direction, greater than that of each of the electrode solder pads 12, and smaller than that of a length of each of the auxiliary solder pads 13 in the first embodiment. That is, the auxiliary solder pads 13A are disposed substantially except for the corner portions of the rectangular plan view shape of the base member 10. With this arrangement, generation of cracks due to thermal stress in the soldered portion of each of the auxiliary solder pads 13A can be inhibited, and therefore time-dependent reduction of bonding strength between the light emitting device 100A and the mounting substrate can be inhibited.

Third Embodiment

A light emitting device according to a third embodiment will be described below with reference to FIG. 5B.

The light emitting device 100B according to the third embodiment is different from the light emitting device 100 according to the first embodiment in that the light emitting device 100B includes a package 1B including auxiliary solder pads 13B in place of the package 1 including auxiliary solder pads 13. The light emitting device 100B is the same as the light emitting device 100 according to the first embodiment except for the shape of the auxiliary solder pads 13B, and accordingly descriptions of other members of the light emitting device 100B are omitted.

Figure 5B:
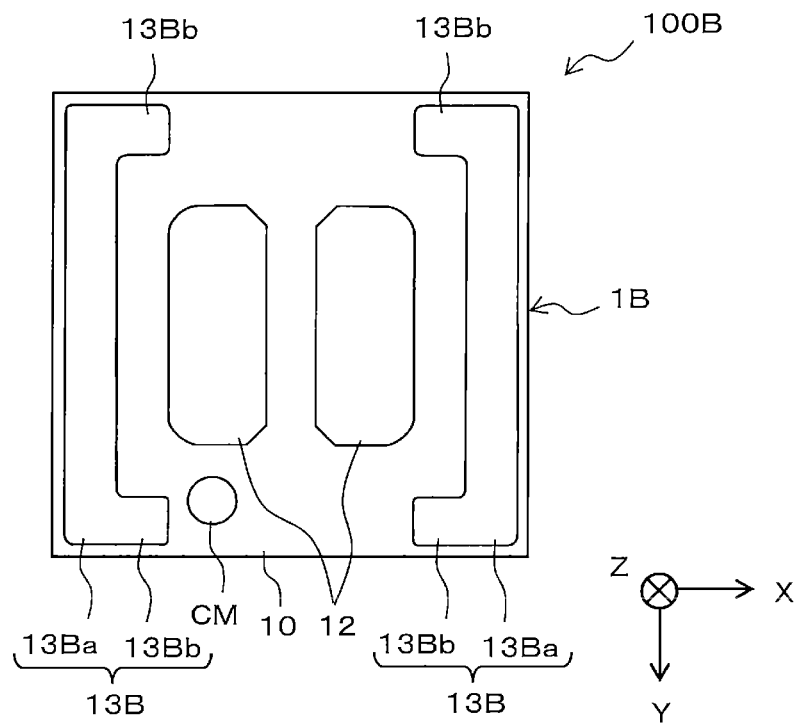
FIG. 5B is a bottom view of a light emitting device according to a third embodiment.

As shown in FIG. 5B, each of the auxiliary solder pads 13B in this embodiment has a square-bracket like shape, that is, a shape similar to a shape of a symbol "[", and has a principal portion 13Ba extending in the second direction along the outer periphery of the base member 10, and extending portions 13Bb, each of which extending inward in the first direction from an end of the principal portion 13Ba. In other words, each of the auxiliary solder pads 13 includes the extending portion 13Bb extending in the X axis direction and the Y axis direction along two adjacent sides of the substantially rectangular plan view shape of the base member 10. With the auxiliary solder pads 13B each having a square bracket-like shape, positional displacement in the Y axis direction as well as in the X direction can be reduced. Further, in each of the auxiliary solder pads 13 each having a square-bracket like shape, the number of corner portions, which are highly effective for positioning in the X axis direction and the Y axis direction, can be increased, and therefore rotational displacement in the XY plane can be reduced.

The principal portion 13Ba in the second direction preferably has a greater length, and the principal portion 13Ba may be the same as each of the auxiliary solder pads 13 in the first embodiment, or, as in the auxiliary solder pads 13A in the second embodiment, may be disposed except for the corner portions of the rectangular plan view shape of the base member 10 to have a reduced length.

Example

An example of the package according to the first embodiment of the present disclosure will be described below.

Figure 3:
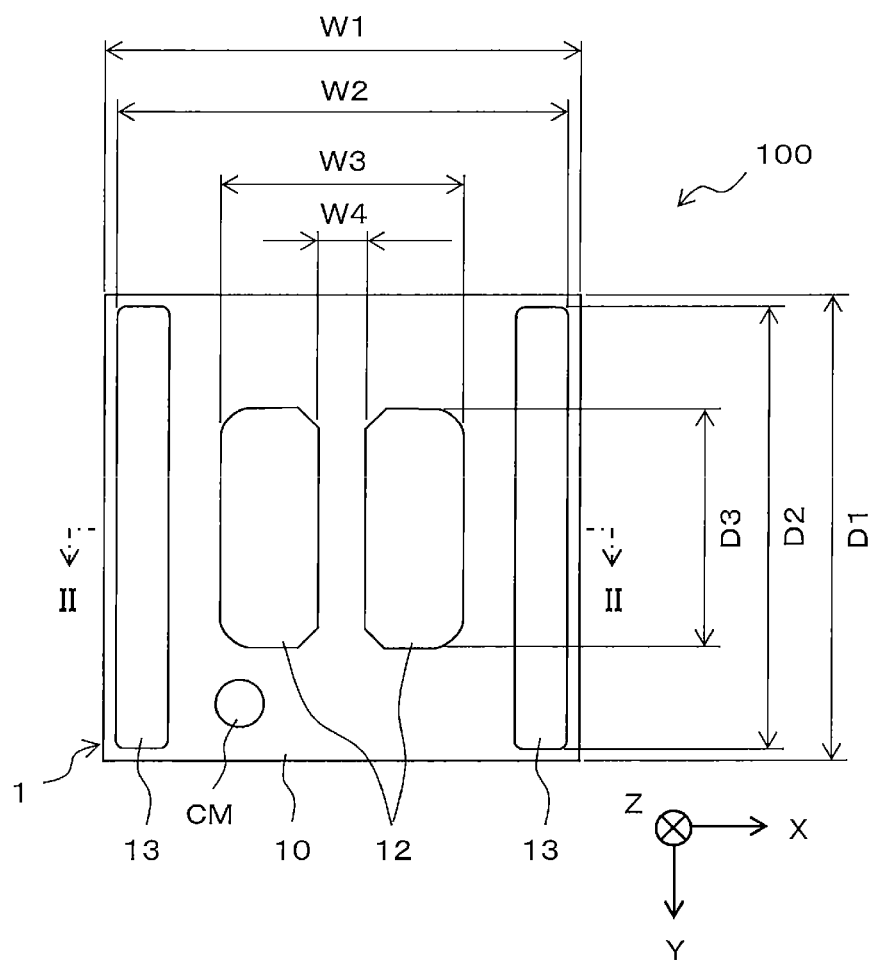
FIG. 3 is a bottom view of the light emitting device according to the first embodiment.
Figure 6:
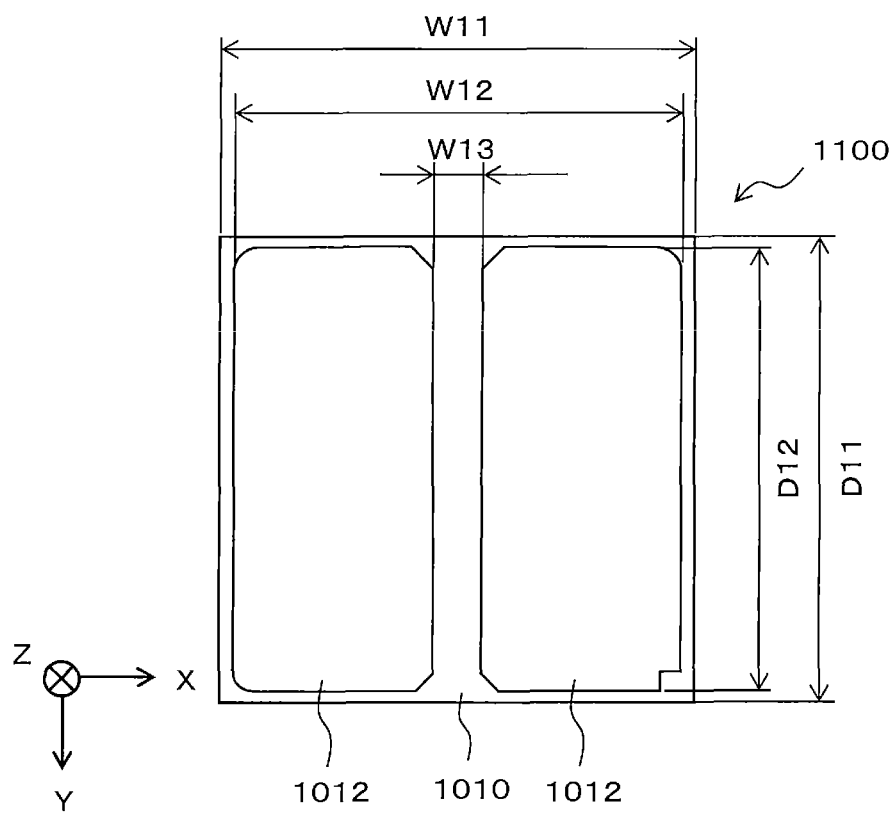
FIG. 6 is a bottom view of a light emitting device in a comparative example.

In the example of the package according to the first embodiment, and a comparative example, packages each of which includes electrode solder pads and auxiliary solder pads and that have shapes shown in FIGS. 3 and 6, respectively, are prepared under the following conditions. Next, each of these packages is mounted on a mounting substrate including lands each having a shape as shown in FIG. 4 by soldering, a thermal shock test is then conducted, and a crack ratio in soldered portions is measured.

Example

Figure 7:
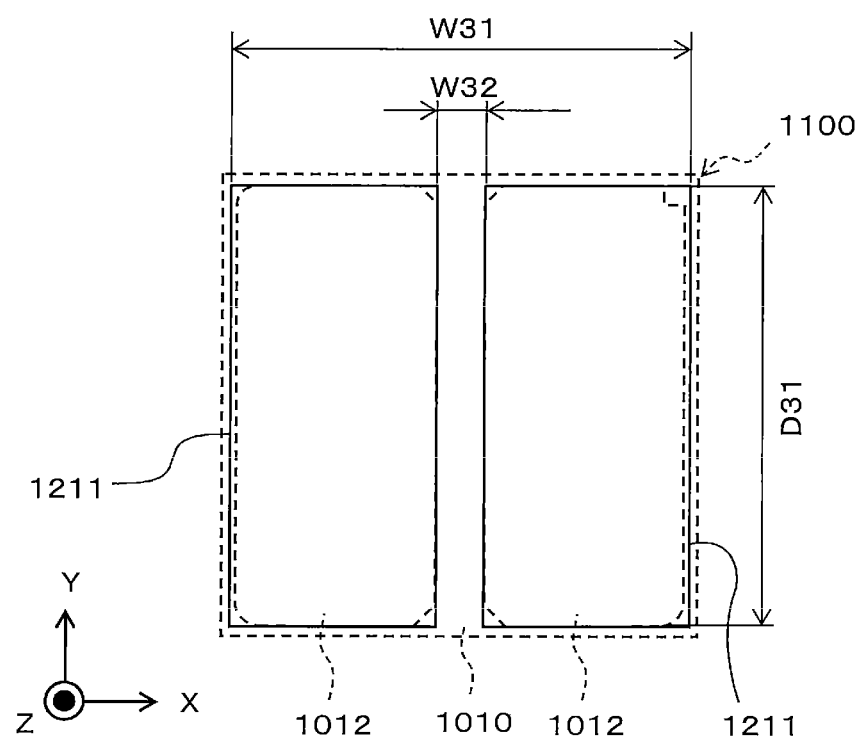
FIG. 7 is a plan view showing shapes of lands of a mounting substrate used in the comparative example.

Package
Base member
  material: AlN, thickness: 0.4 mm
    Electrode solder pads and auxiliary solder pads
  material: Cu, thickness: 30 μm
  Plated layer on a surface of each of the solder pads made of Cu
    material: Ni/Pd/Au layered film, thickness: 2 μm/0.05 μm/0.05 μm
  Dimensions of W1 to W4 and D1 to D3 of the package in FIG. 3 are as follows.
    W1, D1: 7.00 mm
    W2, D2: 6.65 mm W3, D3: 3.60 mm
W4: 0.70 mm
Mounting substrate: NRA-E6.5W manufactured by NIPPON RIKA KOGYOSHO CO., LTD.
Base member
material: Al, thickness: 1.6 mm
Each of lands
material: Cu, thickness: 105 μm
Dimensions of W21 to W24 and D21 to D22 of each of the lands in FIG. 4 are as follows.
W21: 6.75 mm
W22: 4.95 mm
W23: 3.75 mm
W24: 0.70 mm
D21: 6.65 mm
D22: 3.60 mm
Solder: Pb Free Solder M705 manufactured by Senju Metal Industry Co., Ltd. Composition: Sn-3Ag-0.5Cu Comparative Example Package
The material and thickness of the base member and each of the electrode solder pads (including a plated layer) are the same as in the example.
The dimensions of W11 to W13 and D11 to D12 of the package in FIG. 6 are as follows.
W11, D11: 7.00 mm
W12, D12: 6.65 mm
W13: 0.70 mm
Mounting substrate
The material and thickness of each of the base member and the lands are the same as in the mounting substrate used in the example.
For the lands of the mounting substrate, lands each having a shape as shown in FIG. 7 was used. Each of lands 1211 on the mounting substrate has a substantially rectangular shape with substantially the same size as the size of electrode solder pads 1012 in the comparative example as shown in FIG. 7. The dimensions of W31, W32, and D31 of each of the lands 1211 are as follows.
W31: 6.75 mm
W32: 0.70 mm
D31: 6.65 mm
Solder
The same solder as that in the example was used.
Thermal Shock Test
A sample is held at −40° C. for 15 minutes and at 100° C. for 15 minutes alternately 1040 times.
Lateral surfaces of each sample are polished in the depth direction (i.e., Y axis direction), and a cross-section of the package of each package which is parallel to the XZ plane at a central portion of the package in the Y axis direction is observed to measure a crack ratio in each of the solder portions. The crack ratio is calculated by the following formula. The total length of the solder is approximately equal to the width of the electrode solder pad.

crack ratio[%]=length of broken portion of each of the solder portions/total length of a respective one of the solder portions×100

Evaluation Result
The crack ratios in the example and the comparative example are shown below.
Example: 12.2% to 49.4%, 29.9% on average
Comparative Example: 70.8% to 100%, 92.7% on average
In each of the example and the comparative example, testing was conducted on two samples, and the crack ratio in each of the solder portions used for respective one of the two electrode solder pads in each sample was measured. The average crack ratio in each of the example and the comparative example is an average of crack ratios in four electrode solder pads.
The solder crack ratio in each of the auxiliary solder pads was about 100%.
The crack ratio in each of the electrode solder pads in the example is about 30% while that in the comparative example, which simulates a conventional package, being nearly 100%. Accordingly, with the solder pads in the example, an electrical connection can be maintained in practical use. That is, with the package according to the first embodiment of the present disclosure, reliability of mounting of the light emitting device can be improved.
Certain embodiments according to the present disclosure have been described above as examples, and the present disclosure is not limited to the above-described embodiments, and change or modification may be made without departing from the technical scope of the present disclosure.
The semiconductor device according to the present disclosure can be used for lighting apparatus, display devices, backlighting devices for liquid crystal display devices of mobile phones, auxiliary light sources for illumination for moving image, other general consumer light sources and the like as well as semiconductor devices other than light emitting devices.

DENOTATION OF REFERENCE NUMERALS

1, 1A, 1B package (package for a semiconductor device)
10 base member
10a first principal surface
10b second principal surface
11 wiring
12 electrode solder pad
13 auxiliary solder pad
2 light emitting element (semiconductor element)
3 light reflecting member
4 frame body
5 light-transmissive member
6 sealing member
6a lens portion
6b flange portion
7 protective element
100, 100A, 100B light emitting device (semiconductor device)
200 mounting substrate
210 base member
211 electrode solder pad land
212 auxiliary solder pad land
212a protrusion portion
CM cathode mark
What is claimed is:
1. A package for a semiconductor device, the package having an upper surface on which at least one semiconductor element is to be mounted, the package comprising:
a plate-shaped base member having a substantially rectangular shape in a plan view;
first and second electrode solder pads configured to be electrically connected to the semiconductor element when the semiconductor element is mounted on an upper surface of the base member, the electrode solder pads being disposed on a lower surface of the base member such that, in a bottom plan view, the first and second electrode solder pads face each other in a first direction; and first and second additional solder pads disposed on the lower surface of the base member, the additional solder pads being disposed at both sides of the electrode solder pads such that, in the bottom plan view, the first and second electrode solder pads are disposed between the first and second additional solder pads in the first direction, wherein a width of each of the electrode solder pads in the first direction is greater than a width of each of the additional solder pads in the first direction, wherein a length of each of the additional solder pads in a second direction that is perpendicular to the first direction is greater than a length of each of the electrode solder pads in the second direction, and wherein, in the bottom plan view, the first and second additional solder pads are spaced from edges of the base member in the second direction.

2. The package according to claim 1, wherein, in the bottom plan view, the first additional solder pad is disposed along a first side of the base member that extends in the second direction, and the second additional solder pad is disposed along a second side of the base member that extends in the second direction.

3. The package according to claim 1, wherein, in the bottom plan view, the first and second additional solder pads are spaced from edges of the base member in the first direction.

4. The package according to claim 1, wherein, in the bottom plan view, each of the additional solder pads has a substantially rectangular shape that is elongated in the second direction and extends along a respective side of the base member.

5. The package according to claim 1, wherein, in the bottom plan view, each of the electrode solder pads has a substantially rectangular shape that is elongated in the second direction.

6. The package according to claim 1, wherein, in the bottom plan view, an area of a region where each of the additional solder pads is disposed is larger than an area of a region where each of the electrode solder pads is disposed.

7. The package according to claim 1, wherein the base member comprises a ceramic material.

8. The package according to claim 1, wherein the additional solder pads are not electrically connected to the electrode solder pads.

9. A semiconductor device comprising:
the package according to claim 1; and
a semiconductor element disposed on the upper surface of the base member of the package.

10. The package according to claim 1, wherein:
a distance between an outer periphery of the base member and an outer periphery of the first additional solder pad in the first direction is less than or equal to 10% of a width of the base member in the first direction, and
a distance between the outer periphery of the base member and an outer periphery of the second additional solder pad in the first direction is less than or equal to 10% of a width of the base member in the first direction.

11. The package according to claim 1, wherein the first and second electrode solder pads are located at a central part of the lower surface of the base member.

12. The package according to claim 1, wherein:
the first and second electrode solder pads are symmetric over a line extending in the second direction, and
the first and second additional solder pads are symmetric over the line extending in the second direction.

13. The package according to claim 1, wherein:
a distance between an outer periphery of the base member and an outer periphery of the first additional solder pad in the first direction is 100 µm or more, and
a distance between the outer periphery of the base member and an outer periphery of the second additional solder pad in the first direction is 100 µm or more.

14. The package according to claim 1, wherein the additional solder pads are not disposed at corner portions of the lower surface of the base member.

15. The package according to claim 1, wherein each of the additional solder pads includes a principal portion extending in the second direction, and extending portions that extend inward in the first direction from opposite ends of the principal portion.

16. The package according to claim 1, wherein:
the base member has a first lateral surface, and a second lateral surface that is adjacent to the first lateral surface, such that the first lateral surface and the second lateral surface form a corner of the base member, and
in the bottom plan view, a shortest distance between the first lateral surface and the first additional solder pad in the second direction is longer than a shortest distance between the second lateral surface and the first additional solder pad in the first direction.

17. A semiconductor device comprising:
the package according to claim 1; and
a plurality of semiconductor elements disposed on the upper surface of the base member of the package.

18. The semiconductor device according to claim 17, wherein the plurality of semiconductor elements are disposed in a 3×3 matrix.

19. The semiconductor device according to claim 17, further comprising a light-transmissive member in contact with an upper surface of each of the plurality of semiconductor elements.

20. The semiconductor device according to claim 19, wherein the light-transmissive member contains a wavelength conversion substance.

21. An assembly comprising:
the package according to claim 1; and
a mounting substrate comprising:
a plate-shaped mounting substrate base member,
first and second electrode solder pad lands, each of which is bonded to a respective one of the first and second electrode solder pads,
first and second additional solder pad lands, each of which is boded to a respective one of the first and second additional solder pads,
wherein a length of each of the additional solder pad lands in the second direction is greater than a length of each of the electrode solder pad lands in the second direction.

22. The assembly according to claim 21, wherein each of the first and second additional solder pad lands comprises a protrusion portion that protrudes outward in the first direction.

* * * * *